United States Patent [19]

Sandhu et al.

[11] Patent Number: 5,173,327
[45] Date of Patent: Dec. 22, 1992

[54] LPCVD PROCESS FOR DEPOSITING TITANIUM FILMS FOR SEMICONDUCTOR DEVICES

[75] Inventors: Gurtej S. Sandhu; Trung T. Doan, both of Boise, Id.

[73] Assignee: Micron Technology, Inc., Boise, Id.

[21] Appl. No.: 717,234

[22] Filed: Jun. 18, 1991

[51] Int. Cl.$^5$ ............................................. B05D 3/06
[52] U.S. Cl. .................................. 427/573; 427/253; 427/255.1; 427/294; 427/422; 427/427; 427/576; 437/245
[58] Field of Search ............... 427/38, 39, 255.1, 294, 427/252, 253, 422, 427; 437/200, 192, 245; 148/DIG. 19

[56] References Cited

U.S. PATENT DOCUMENTS

| | | | |
|---|---|---|---|
| 3,697,343 | 10/1972 | Cuomo et al. | 427/253 |
| 4,794,019 | 12/1988 | Miller | 427/253 |
| 4,830,891 | 5/1989 | Nishitani et al. | 427/253 |
| 4,849,260 | 7/1989 | Kusumoto et al. | 427/253 |

Primary Examiner—Janyce Bell
Attorney, Agent, or Firm—David J. Paul

[57] ABSTRACT

The present invention describes a CVD process to deposit a titanium film at a high deposition rate that has excellent uniformity and step coverage while avoiding gas phase nucleation and coating of the reactor chamber walls. The vapor of a heated liquid titanium source enters a modified, plasma enhanced, cold wall reaction chamber and is mixed with $H_2$ as it reaches a wafer substrate surface. As the gas vapors reach the heated wafer substrate a chemical reaction of $TiCl_4 + 2H_2 \rightarrow Ti + 4HCl$ is triggered, thereby depositing a uniform titanium film upon the substrate surface. The deposition rate is further enhanced by the presence of rf plasma above the substrate's surface.

6 Claims, 2 Drawing Sheets

LPCVD PROCESS FOR DEPOSITING TITANIUM FILMS FOR SEMICONDUCTOR DEVICES

FIELD OF THE INVENTION

This invention relates to semiconductor circuit fabrication and more particularly to a process for depositing titanium films across a wafer surface with a high degree of uniformity.

BACKGROUND OF THE INVENTION

In semiconductor manufacturing, technology and competition continue to contribute to shrinking die size and increased wafer size which result in a large number of die per wafer. In order to fabricate a high percent of reliable devices across the wafer, the uniformity of a film across the wafer deposited at any given process step becomes critical. The method used to form thin films must be economical with the resultant films exhibiting such characteristics as having a uniform thickness and good step coverage, high purity and density, good electrical properties, and excellent adhesion to name a few. Conventional approaches to deposit films has been by the use of one of the many chemical vapor deposition (CVD) processes.

A basic CVD process consists of the following sequence of steps: 1) a given composition and flow rate of reactant gases and diluent (or carrier) inert gases are released into a reaction chamber; 2) the gas species reactants are adsorbed on a silicon wafer substrate; 3) the loosely bonded atoms migrate across the substrate and cause filmforming chemical reactions, and 4) the gaseous by-products of the reaction are desorbed and removed from the reaction chamber. The chemical reactions that lead to formation of a solid material may be either heterogeneous (reaction occurs only on the wafer surface) or homogeneous (reaction occurs in the gas phase). Heterogeneous reactions are desirable as the reaction occurs on a heated surface and therefore can be controlled to produce good quality films.

Homogeneous reactions are less desirable as they form gas phase clusters of material (gas phase nucleation) which results in poor adhesion and low density films, as well as create particulates in the reaction chamber.

Two basic CVD reactor types used to deposit films are the hot wall reactor, using low pressure (typically 1 Torr or less) and high temperature (600° C. or greater) and the cold wall reactor, using atmospheric pressure and a low temperature (<600° C.). Both reactor types have their advantages and disadvantages.

The main advantages of the cold wall reactor are its simple reactor construction, a fast deposition rate and a low deposition temperature. The main disadvantages of the cold wall reactor include poor step coverage and gas phase nucleation.

Additionally, the cold wall reactor may be of the plasma enhanced type wherein the chemical reaction is further promoted by heating the reactor with an rf generator, thereby creating free electrons (plasma) within the discharge region. The plasma enhanced CVD system produce films with desirable properties of good adhesion, good step cover and adequate electrical properties, to name a few.

A hot wall reactor provides deposited films with excellent purity and uniformity, while maintaining conformal step coverage. However, to produce this quality film, the hot wall reactor must use a high deposition temperature while the deposition rate is low. In industry, the advantages of the low pressure hot wall reactor out weigh its disadvantages, thus allowing the hot wall reactor to become the most widely used method for depositing films such as polysilicon and silicides.

A typical low pressure hot wall reactor is depicted in FIG. 1. Normal operation constitutes heating reactor chamber 1 and wafer boat 2 to a desired temperature by a heat source 3. The desired deposition pressure is set and controlled by pressure sensor 4, pressure switch 5 and pressure control valve 6. Reactor chamber is then flooded with a source gas and a small volume of a carrier gas is then input into the reactor chamber in order to set the deposition pressure. The source gas and carrier gas react to form a film on the heated wafer's substrate and the resultant gas is vented through exhaust 7 with the aid of blower 8.

The present invention may be used in the conventional CVD system mentioned above or it may be implemented in a CVD system as the one disclosed in pending application Ser. No. 704,533, also submitted by the same inventors of the present invention.

The best mode of the present invention uses the cold wall CVD system disclosed in pending application Ser. No. 704,533 and in addition, plasma is introduced into the system in order to enhance the deposition rate, lower the deposition temperature and to improve film quality. This plasma enhanced CVD system is used to deposit a titanium film, at a high deposition rate, that has excellent uniform density and step coverage while avoiding gas phase nucleation and coating of the reactor chamber walls.

SUMMARY OF THE INVENTION

The invention is directed to a uniform titanium (Ti) film deposition technique for use in a semiconductor fabrication process. The technique described herein, describes a process to deposit Ti films uniformly across the wafer surface which has improved step coverage over a conventional method of placing metal films by sputtering techniques.

The process to be described in this embodiment uses a cold-wall CVD process to deposit a Ti film on a silicon wafer surface. The cold-wall CVD process is preferred as the colder walls of the reactor chamber help deter unwanted reactions at the wall surface which can cause particulate, however a hot-wall reaction chamber may be used if so desired. The main focus of the present invention is the ability to deposit Ti films via of a chemical reaction $TiCL_4 + 2H_2 \rightarrow Ti + 4HCl$.

This reaction can be made to proceed at a faster rate in the presence of rf plasma by ionizing the hydrogen gas which allows the $H^+$ ions to facilitate the reaction.

A chemical vapor deposition method for depositing a metal film on a wafer surface, is disclosed with the method comprising:

a) heating a wafer inside a reaction chamber;

b) forming a gas mixture from a reactive gas and a metal source gas such that the flow rate of the reactive gas is 2 to 10 times the flow rate of the metal source gas;

c) presenting the gas mixture to the surface of the heated wafer;

d) depositing the metal film on the heated wafer surface, with the heated wafer surface triggering a chemical reaction between the metal source gas and the reactive gas;

e) maintaining a constant deposition pressure; and f) removing the reactant gases from said reaction chamber.

DETAILED DESCRIPTION OF THE PREFERRED EMBODIMENT

The following discussion is in terms of best mode application, however, if one skilled in the art chooses to use the present invention with any CVD system, with or without plasma, a gas reactive and a Titanium source gas need not be pre-mixed.

The invention is directed to a uniform titanium film depositing technique for use in a semiconductor fabrication process, such as a memory semiconductor device and in particular a dynamic random access memory device. The process to be described in this embodiment uses a single wafer, cold-wall CVD process to deposit a titanium film on a silicon wafer surface as illustrated in the cold wall CVD system of FIG. 2.

Figure 1:
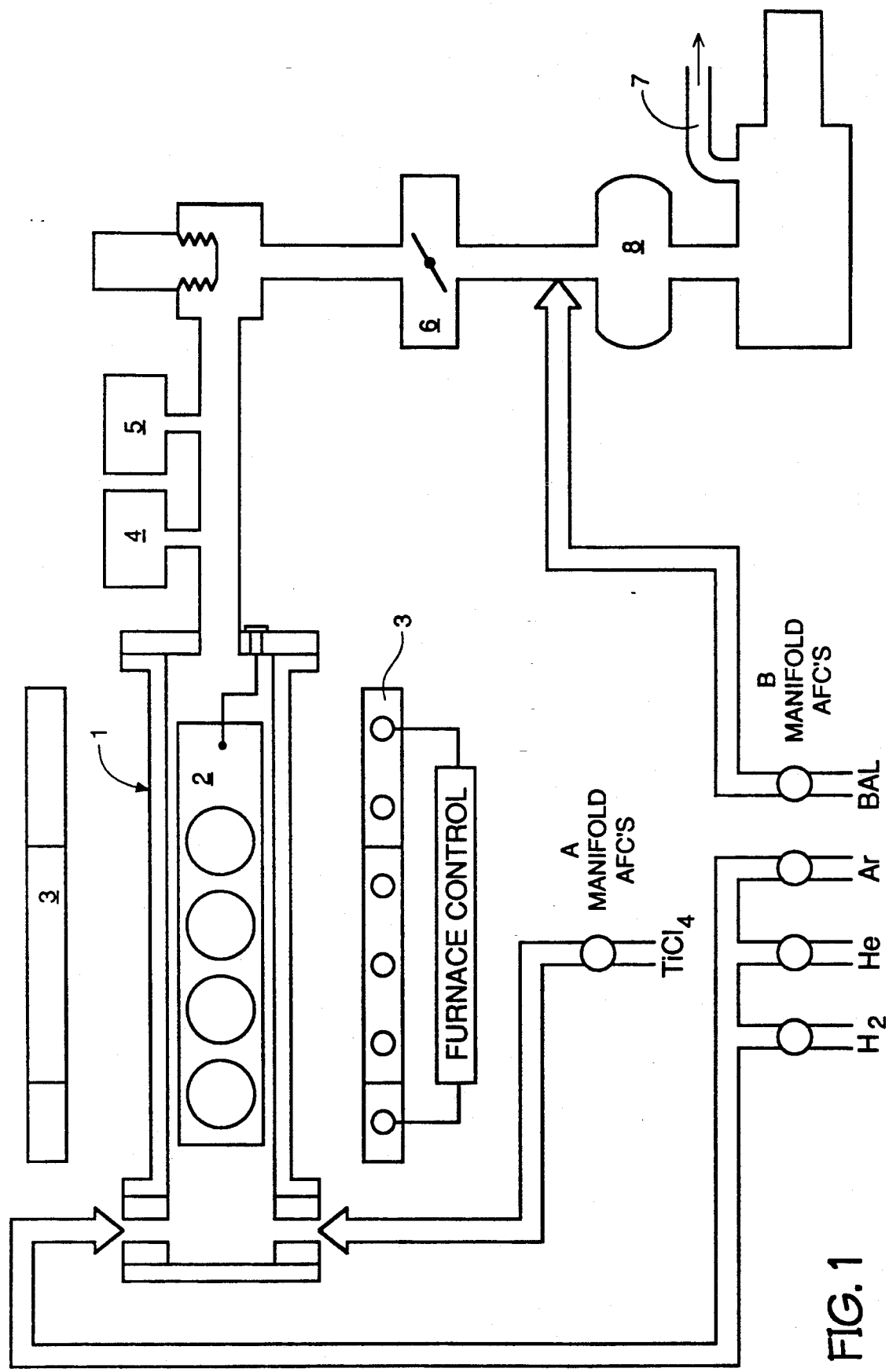
FIG. 1 shows a typical hot-wall, low-pressure chemical vapor deposition system.
Figure 2:
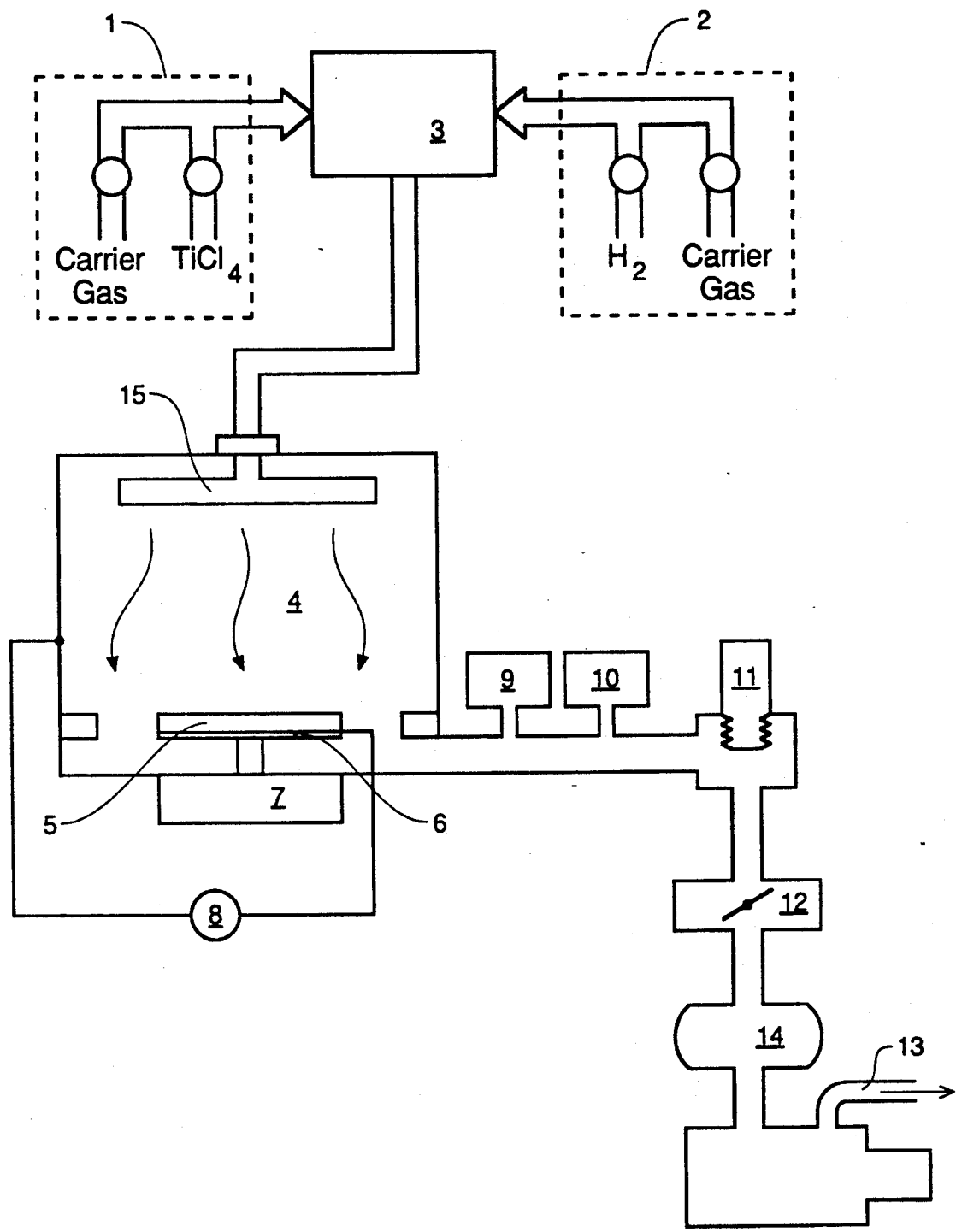
FIG. 2 shows the use of the proposed chemical reaction in an improved cold-wall, high pressure chemical vapor deposition system.

Referring now to FIG. 2, a typical cold wall CVD system has been altered according to FIG. 2 of application Ser. No. 704,533 and incorporates the present invention. A Titanium source gas, obtained by heating the liquid compound of $TiCl_4$, available from control valve 1 and a reactive gas, $H_2$, available from control valve 2 are diverted into gas pre-mix chamber 3. This pre-mixture of $TiCl_4$ gas vapor and $H_2$ is now available to enter cold wall reaction chamber 4. If so desired a carrier gas, such as Argon (Ar) or Helium (He) may be added to one or both of the Titanium source gas and the hydrogen. For example, the He may be allowed to bubble through the heated Titanium source gas to further enhance formation of the Titanium gas vapor, while Ar might be added to the hydrogen in order to dilute the hydrogen and/or set a desired deposition pressure. The flow rate of the reactive gas may be as great as 2 to 10 times the amount of the flow rate of the Titanium source gas.

In cold wall reaction chamber 4, silicon wafer 5 is heated by convection from substrate holder 6 (such as a graphite or alumina boat) that in turn is heated to a preferred temperature of 400 degrees Celsius via halogen lamps 7. This is a typical cold wall heating method known to those skilled in the art which helps avoid heating of the reactor's chamber walls.

Now the pre-mixed gas combination of $TiCl_4$ and $H_2$ enter reaction chamber 4 through shower head 15. An rf voltage, supplied by rf generator 8, is applied between substrate holder 6 and reaction chamber 4 thus creating ionized H species (rf plasma) in the space above wafer 5. These gases begin to react inside reaction chamber 4 as they are adsorbed at the heated surface of wafer 5. An ensuing chemical reaction of $TiCl_4 + 2H_2 \rightarrow Ti + 4HCl$ takes place, thereby depositing a uniform film of Titanium (Ti) upon the surface of wafer 5. This reaction is further enhanced by the presence of $H^+$ rf plasma that speeds up the deposition rate. A constant deposition pressure between 0.2 and 2 Torr monitored and maintained by conventional pressure control components consisting of pressure sensor 9, pressure switch 10, air operating vacuum valve 11 and pressure control valve 12. Reactant gas, HCl, given off by the chemical reaction in reaction chamber 4, and the carrier gas (if carrier gases are used), pass through particulate filter 13 and escapes through exhaust vent 14 with the aid of roots blower 14 to complete the process.

It is to be understood that although the present invention has been described with reference to a preferred embodiment, various modifications (such as using conventional CVD techniques with a single or multiple wafer reaction chamber in place), known to those skilled in the art, may be made to the process steps presented herein without departing from the invention as recited in the several claims appended hereto.

We claim:

1. A chemical vapor deposition method for depositing a Titanium film on a silicon wafer surface during fabrication of a semiconductor device, said method comprising:

a) heating a silicon wafer inside a reaction chamber by heating a wafer holder securing said silicon wafer;

b) pre-mixing of $H_2$ gas and a $TiCl_4$ gas such that the flow rate of said $H_2$ gas is 2 to 10 times the flow rate of said $TiCl_4$ gas;

c) presenting said pre-mixture of gas to surface of said heated silicon wafer;

d) generating rf plasma inside said reaction chamber;

e) depositing said Titanium film on said heated silicon wafer surface, said deposition caused by a chemical reaction of $TiCl_4 + 2H_2 \rightarrow Ti + 4HCl$;

f) maintaining a constant deposition pressure between 0.2 and 2 Torr; and g) removing reactant gases from said reaction chamber.

2. The method of claim 1, wherein said reaction chamber is a hot wall reaction chamber.

3. The method of claim 1, wherein said gas mixture is presented to said wafer surface via a shower head.

4. The method of claim 1, wherein said constant deposition pressure is maintained between 0.2 and 2 Torr.

5. A chemical vapor deposition method for depositing a uniform film of Titanium on a silicon wafer surface during the fabrication of a semiconductor memory device, said method comprising:

a) heating a silicon wafer inside a cold wall reaction chamber by heating a wafer holder securing said silicon wafer with halogen lamps to a temperature of approximately 400° C.;

b) pre-mixing $H_2$ gas and $TiCl_4$ gas such that the flow rate of said $H_2$ gas is 2 to 10 times the flow rate of said $TiCl_4$ gas;

c) presenting said pre-mixture of gas to surface of said heated silicon wafer via a shower head;

d) generating an ionized H. species of rf plasma inside said reaction chamber;

e) depositing said uniform Titanium film on said heated silicon wafer surface, said uniform Titanium film deposition obtained by said heated silicon wafer surface triggering a chemical reaction of $TiCl_4 + 2H_2 \rightarrow Ti + 4HCl$;

f) maintaining a constant deposition pressure between 0.2 and 2 Torr; and g) removing reactant gases from said cold wall reaction chamber.

6. A chemical vapor deposition method for depositing a uniform film of Titanium on a silicon wafer surface during the fabrication of a semiconductor memory device, said method comprising:

a) heating a silicon wafer inside a cold wall reaction chamber by heating a wafer holder securing said silicon wafer with halogen lamps to a temperature of approximately 400° C.;

b) pre-mixing $H_2$ gas and $TiCl_4$ gas such that the flow rate of said $H_3$ gas is 2 to 10 times the flow rate of said $TiCl_4$ gas;

c) presenting said pre-mixture of gas to surface of said heated silicon wafer;

d) generating an ionized $H^+$ species of rf plasma inside said reaction chamber;

e) depositing said uniform Titanium film on said heated silicon wafer surface, said uniform Titanium film deposition obtained by said heated silicon wafer surface triggering a chemical reaction of $TiCl_4 + 2H_2 \rightarrow Ti + 4HCl$;

f) maintaining a constant deposition pressure between 0.2 and 2 Torr; and g) removing reactant gases from said cold wall reaction chamber.

* * * * *

UNITED STATES PATENT AND TRADEMARK OFFICE
CERTIFICATE OF CORRECTION

PATENT NO. : 5,173,327
DATED : December 22, 1992
INVENTOR(S) : Gurtej S. Sandhu et al.

It is certified that error appears in the above—identified patent and that said Letters Patent is hereby corrected as shown below:

In Col 1, line 63, rewrite "cover" as -- coverage --;

In Col 2, line 48, rewrite "particulate" as -- particulates --;

In Col 3, line 16, rewrite the phrase "gas reactive" as -- reactive gas --;

In Col 3, line 64, between the words "Torr and monitored" insert -- is --;

In Col 4, line 3, rewrite the number "14" as -- 13 --; and

In Col 4, line 54, rewrite "H." as -- H+ --.

Signed and Sealed this

First Day of February, 1994

Attest:

BRUCE LEHMAN

*Attesting Officer*   *Commissioner of Patents and Trademarks*